United States Patent
Remla et al.

(10) Patent No.: US 10,623,174 B1
(45) Date of Patent: Apr. 14, 2020

(54) LOW LATENCY DATA TRANSFER TECHNIQUE FOR MESOCHRONOUS DIVIDED CLOCKS

(71) Applicant: Xilinx, Inc., San Jose, CA (US)

(72) Inventors: Riyas Noorudeen Remla, Singapore (SG); Warren E. Cory, Redwood City, CA (US); Chee Chong Chan, Singapore (SG)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/217,589

(22) Filed: Dec. 12, 2018

(51) Int. Cl.
| | | |
|---|---|---|
| *H04L 7/04* | (2006.01) | |
| *H03L 7/00* | (2006.01) | |
| *H03M 13/33* | (2006.01) | |
| *H03M 13/00* | (2006.01) | |

(52) U.S. Cl.
CPC ............... *H04L 7/04* (2013.01); *H03L 7/00* (2013.01); *H03M 13/00* (2013.01); *H03M 13/336* (2013.01)

(58) Field of Classification Search
CPC combination set(s) only.
See application file for complete search history.

(56) References Cited

U.S. PATENT DOCUMENTS

| | | | |
|---|---|---|---|
| 5,652,530 | A | 7/1997 | Ashuri et al. |
| 9,992,049 | B1* | 6/2018 | Novellini ............... H03L 7/07 |
| 2003/0053489 | A1 | 3/2003 | Zerbe et al. |
| 2004/0027166 | A1 | 2/2004 | Mangum et al. |
| 2005/0024107 | A1* | 2/2005 | Takai ................. H03K 5/133 327/158 |
| 2005/0062505 | A1* | 3/2005 | Takahashi ............ H03L 7/07 327/99 |
| 2007/0081618 | A1* | 4/2007 | Jeon .................... H03L 7/087 375/360 |
| 2007/0285178 | A1* | 12/2007 | Werker ............... H03L 7/087 331/16 |
| 2008/0204091 | A1* | 8/2008 | Choo .................. G11C 5/02 327/149 |
| 2009/0049212 | A1 | 2/2009 | Mangano et al. |
| 2011/0022934 | A1 | 1/2011 | Oh et al. |
| 2015/0070202 | A1* | 3/2015 | Dedic ............... H03M 1/0624 341/144 |
| 2015/0139377 | A1* | 5/2015 | Song ................. H03H 11/20 375/371 |
| 2015/0180642 | A1* | 6/2015 | Hsieh ................ H04L 7/0025 375/233 |

(Continued)

*Primary Examiner* — Linda Wong
(74) *Attorney, Agent, or Firm* — Craige Thompson

(57) ABSTRACT

Electrical circuits and associated methods relate to performing a phase alignment by providing N copies of clock alignment circuits, enabling and selecting different clock alignment circuits to achieve an initial phase alignment. In an illustrative example, a phase alignment circuit may include a first clock alignment circuit configured to find a first phase alignment point and a second clock alignment circuit configured to find a second phase alignment point. A control circuit may be configured to select a primary clock alignment circuit from the first clock alignment circuit and the second clock alignment circuit and generate a digital command signal to control a phase interpolator. In various embodiments, by setting the control circuit, the same phase alignment circuit may be used to perform phase alignments between clock domains with different frequencies.

20 Claims, 10 Drawing Sheets

(56) References Cited

U.S. PATENT DOCUMENTS

| | | | |
|---|---|---|---|
| 2015/0188694 A1* | 7/2015 | Kuan | H04L 25/14 375/355 |
| 2015/0243311 A1* | 8/2015 | Grundvig | G06F 16/245 360/39 |
| 2015/0280857 A1* | 10/2015 | Bianciotto | H04B 10/614 398/65 |
| 2016/0352388 A1* | 12/2016 | Lane | H04B 3/54 |

\* cited by examiner (A)

(B)

(C)

LOW LATENCY DATA TRANSFER TECHNIQUE FOR MESOCHRONOUS DIVIDED CLOCKS

TECHNICAL FIELD

Various embodiments relate generally to phase alignment between clock domains having different frequencies.

BACKGROUND

Data represents information that has useful value. Data can take the form of stored information. Data storage can be in analog form. Data storage can also be in digital form.

Data can also be in digital format communicated between two nodes. When data is communicated, for example, it can be received and interpreted as a function of time. Some systems that receive communicated digitally-formatted data are based on a clock that determines when a voltage signal is sampled to decide whether a symbol in a data stream is, for example, a one or a zero. Sometimes, a data is received without knowing its specific phase information. Phase alignments are performed before launching data or receiving data to ensure data accuracy and data integrity.

SUMMARY

Electrical circuits and associated methods relate to performing a phase alignment by providing N copies of clock alignment circuits, enabling and selecting different clock alignment circuits to achieve an initial phase alignment. In an illustrative example, a phase alignment circuit may include a first clock alignment circuit configured to find a first phase alignment point and a second clock alignment circuit configured to find a second phase alignment point. A control circuit may be configured to select a primary clock alignment circuit from the first clock alignment circuit and the second clock alignment circuit and generate a digital command signal to control a phase interpolator. In various embodiments, by setting the control circuit, the same phase alignment circuit may be used to perform phase alignments between clock domains with different frequencies.

Electrical circuits and associated methods may also relate to maintaining a good phase alignment by a 180 degree phase rotation of a faster clock and using a phase interpolator to monitor and dynamically control a second beacon path circuit to compensate external temperature and voltage change.

In an illustrative example, a phase alignment circuit and method are described for a 1:2 data transfer and 2:1 data transfer. In some embodiments, for the 1:2 data transfer, no local beacon signals may be needed to find an alignment. In some embodiments, two local beacon signals may be used to accelerate the phase alignment for the 2:1 data transfer. In various embodiments, an electrical circuit and corresponding method may be described to maintain a good alignment during data transfer between two clock domains operating at different frequencies.

Various embodiments may achieve one or more advantages. For example, some embodiments may provide a substantially reduced or minimal latency data transfer. Some embodiments may achieve a balanced setup/hold margin and eliminate the duty cycle distortion (DCD) from impacting setup/hold margin. Some embodiments may obtain a faster phase alignment with reduced circuit resources.

In one exemplary aspect, a circuit includes a first clock alignment circuit. The first clock alignment circuit includes a first phase alignment detection circuit configured to monitor a first signal and detect a first phase alignment point between a second signal and a third clock signal. The circuit also includes a second clock alignment circuit. The second clock alignment circuit includes a second phase alignment detection configured to monitor the first signal and detect a second phase alignment point between the second signal and the third clock signal. The circuit also includes a control circuit configured to select a primary circuit from the first clock alignment circuit and the second clock alignment circuit and generate a command signal to control a phase interpolator. The control circuit is further configured to generate a toggling enable signal to enable the first clock alignment circuit and the second first clock alignment circuit alternately.

In some embodiments, the controller circuit may include an enable signal generator and a state machine, the enable signal generator may be configured to generate the toggling enable signal, and the state machine may be configured to control the selection and the generation of the command signal. In some embodiments, the first clock alignment circuit may also include a first local beacon generator configured to generate a first local beacon signal. The first clock alignment circuit may also include a first XOR gate configured to receive the first signal and the first local beacon signal and generate a fourth signal. The first phase alignment detection circuit may be configured to monitor the fourth signal and detect the first phase alignment point between the second signal and the third clock signal.

In some embodiments, the second clock alignment circuit may also include a second local beacon generator configured to generate a second local beacon signal. The second clock alignment circuit may also include a second XOR gate configured to monitor the first signal and the second local beacon signal and generate a fifth signal. The second phase alignment detection circuit may be configured to receive the fourth signal and detect the second phase alignment point between the second signal and the third clock signal.

In some embodiments, the circuit may also include a synchronizer circuit configured to generate the first signal by sampling the second signal in response to the third clock signal. In some embodiments, when the circuit is used for a 1:2 data transfer, the first clock alignment circuit may be selected as the primary clock alignment circuit, and the first local beacon signal may be configured to 0. In some embodiments, when the circuit is used for a 1:1 data transfer, the first clock alignment circuit may be selected as the primary clock alignment circuit and the first local beacon signal and the second local beacon signal may be configured to toggle at the same frequency with the first signal. In some embodiments, when the circuit is used for a 2:1 data transfer, the primary clock alignment circuit selected by the controller circuit may be the one with a faster phase alignment between the first phase alignment and the second phase alignment.

In some embodiments, the circuit may also include a 2-input multiplexer coupled to the first clock alignment circuit and the second clock alignment circuit and controlled by the phase alignment controller to generate an output. In some embodiments, the output of the multiplexer may be configured to the phase interpolator to adjust a phase of the third clock signal.

In another exemplary aspect, a phase alignment method includes providing a first clock alignment circuit to detect a first phase alignment between a second signal and a third clock signal. The method also includes providing a second clock alignment circuit to detect a second phase alignment between the second signal and the third clock signal. The method also includes generating, with a controller circuit, a enable signal to enable the first clock alignment circuit and the second clock alignment circuit and selecting a primary clock alignment circuit from the first and the second clock alignment circuit to control a phase interpolator. The selected primary clock alignment circuit is the one that detects a phase alignment first.

In some embodiments, the controller circuit may include an enable signal generator and a state machine, the enable signal generator may be configured to generate the toggling enable signal, and the state machine may be configured to select the primary clock alignment circuit.

In some embodiments, the first clock alignment circuit may also include a first local beacon generator configured to generate a first local beacon signal, a first XOR gate configured to receive the first signal and the first local beacon signal and generate a fourth signal, and a first phase alignment detection circuit configured to monitor the fourth signal and detect the first phase alignment between the second signal and the third clock signal. In some embodiments, the second clock alignment circuit may also include a second local beacon generator configured to generate a second local beacon signal, a second XOR gate configured to monitor the first signal and the second local beacon signal and generate a fifth signal, and a second phase alignment detection circuit configured to receive the fourth signal and detect the second phase alignment between the second signal and the third clock signal. In some embodiments, the method may also include generating, with a synchronizer circuit, the first signal by sampling the second signal in response to the third clock signal.

In some embodiments, when the method is used for a 1:2 data transfer, the method may include enabling only the first clock alignment circuit and configuring the first local beacon signal to 0. In some embodiments, when the method is used for a 1:1 data transfer, the method may include enabling only the first clock alignment circuit and configuring first local beacon signal to have a frequency that is twice a frequency of the third clock signal. In some embodiments, when the method is used for a 2:1 data transfer, the enable signal may be a toggling enable signal that alternately enables the first clock alignment circuit and the second clock alignment circuit.

In some embodiments, the first clock alignment circuit and the second clock alignment circuit may be coupled to a 2-input multiplexer, the multiplexer may be controlled by the phase alignment controller to generate an output. The output of the multiplexer may be configured to the phase interpolator to adjust a phase of the third clock signal.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION

Figure 9:
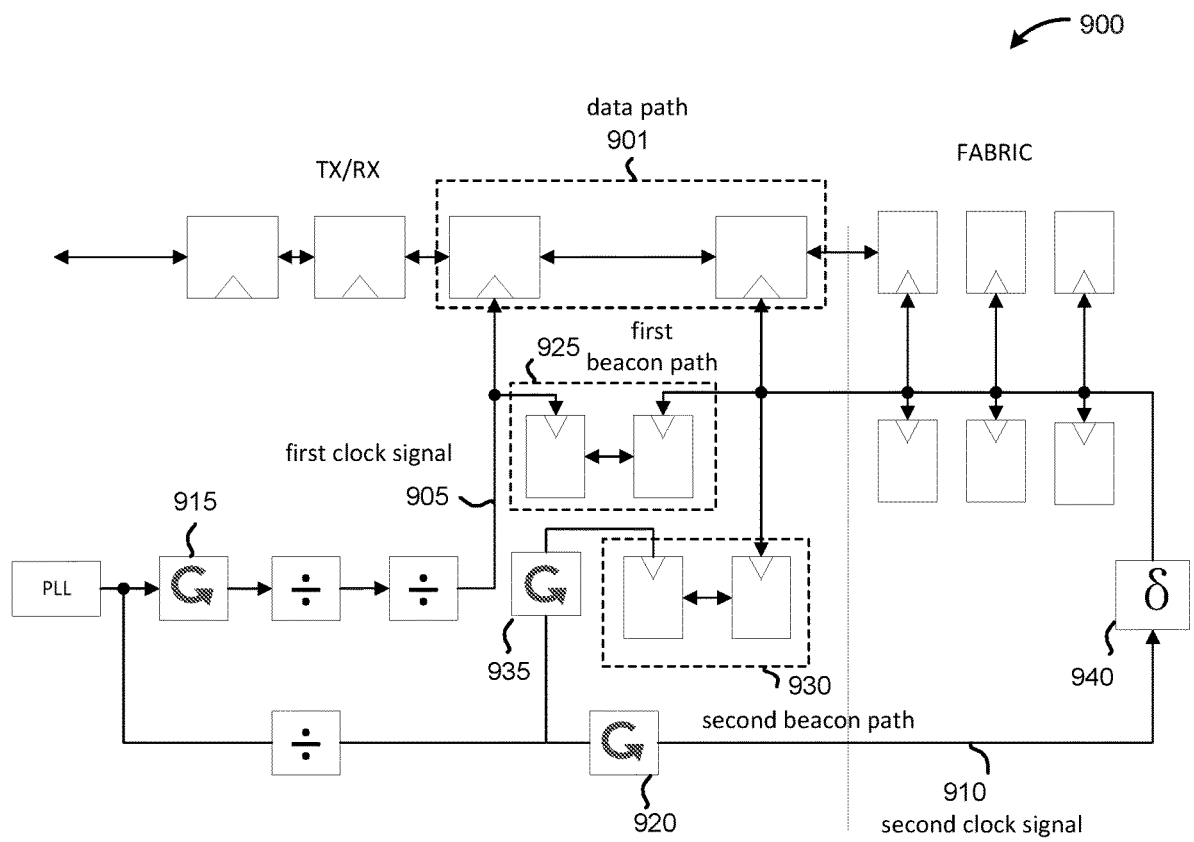
FIG. 9 depicts exemplary electrical circuits configured to perform data transfers and maintain a good phase alignment in a single lane.
Figure 10:
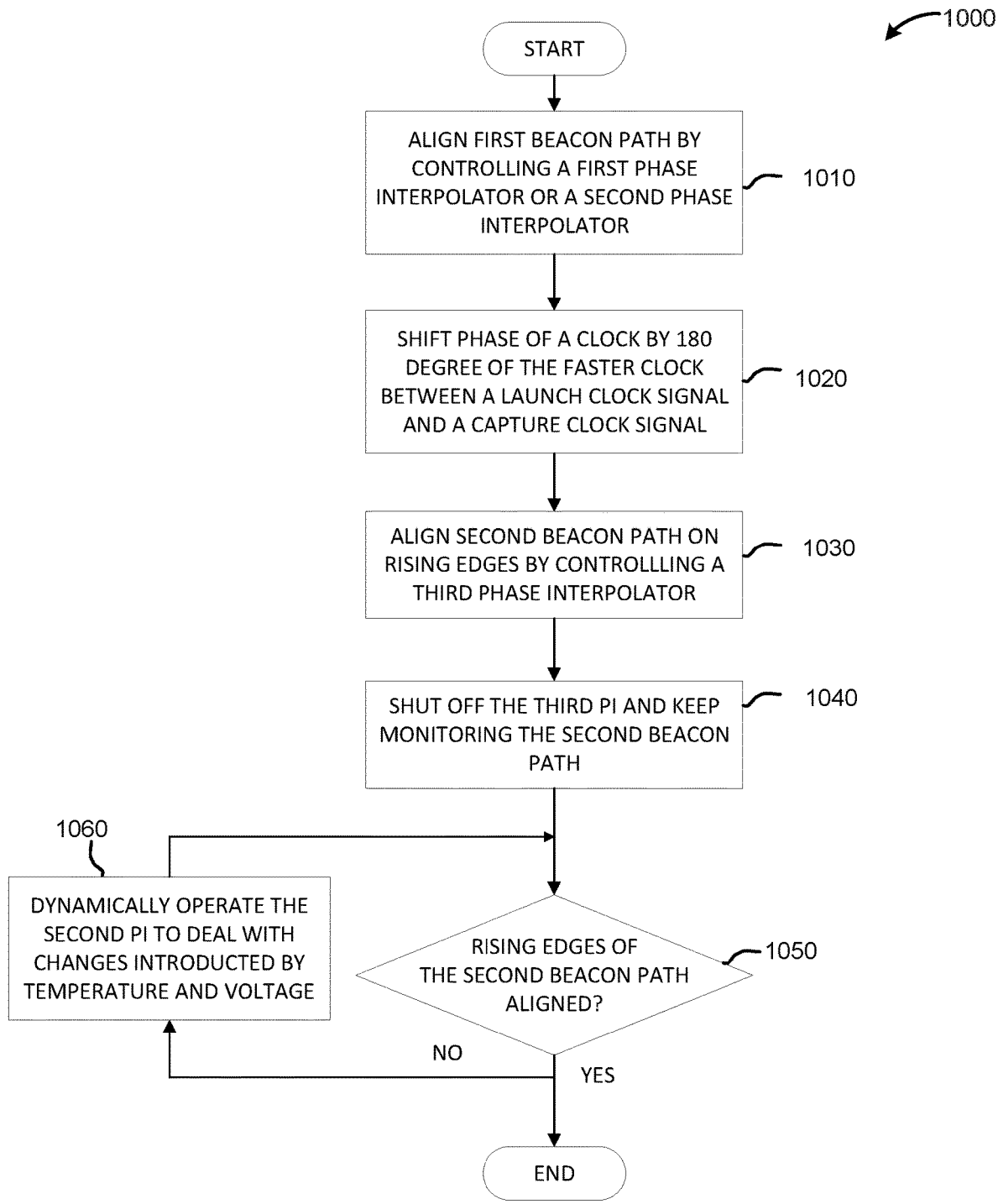
FIG. 10 depicts a flow chart of an exemplary process to maintain an aligned phase relationship.

To aid understanding, this document is organized as follows. First, an exemplary programmable integrated circuit (IC) on which the disclosed circuits and processes may be implemented is briefly introduced with reference to FIG. 1, and a block diagram of exemplary data paths for Div-1 to Div-N and Div-N to Div-1 is briefly introduced with reference to FIG. 2. Second, with reference to FIGS. 3-5, the discussion turns to exemplary embodiments that illustrate how to align phases for data transferred between Div-1 and Div-N. Then, with reference to FIGS. 6-8 the discussion turns to an exemplary method that illustrate how to align phases. With reference to FIGS. 9-10, electrical circuits and method to maintain good phase alignments in a single lane are further discussed.

Figure 1:
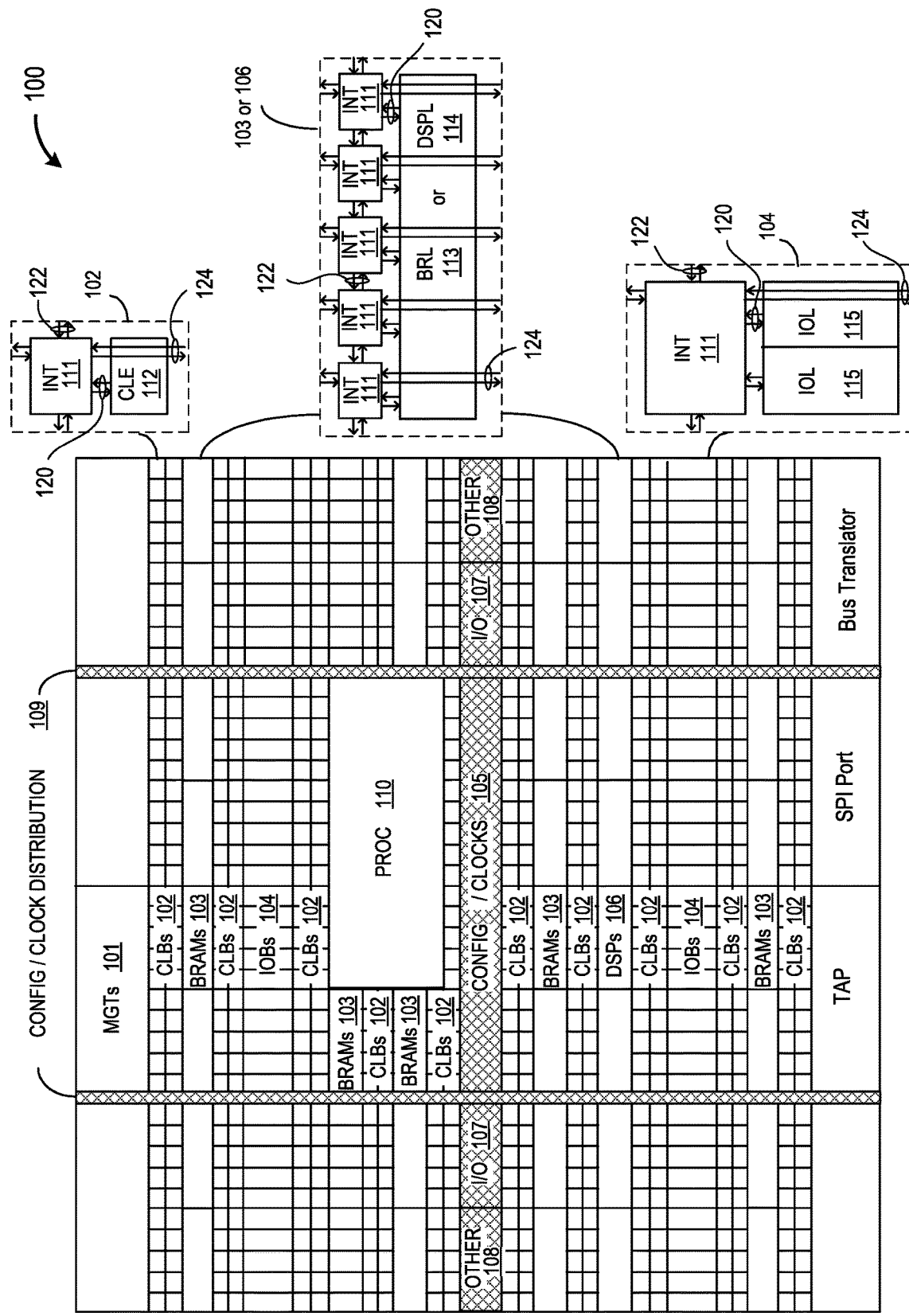
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

At least one transceiver may be embedded in the FPGA to perform data transmitting and data receiving during communication. To decrease data loss and keep data accurate, phase alignment between a clock signal and a data signal need to be considered. An FPGA may be programmed to work for data transferring between different clock domains. A common phase alignment circuit that is suitable for clock domains of different frequencies may increase operability and generality.

Figure 2:
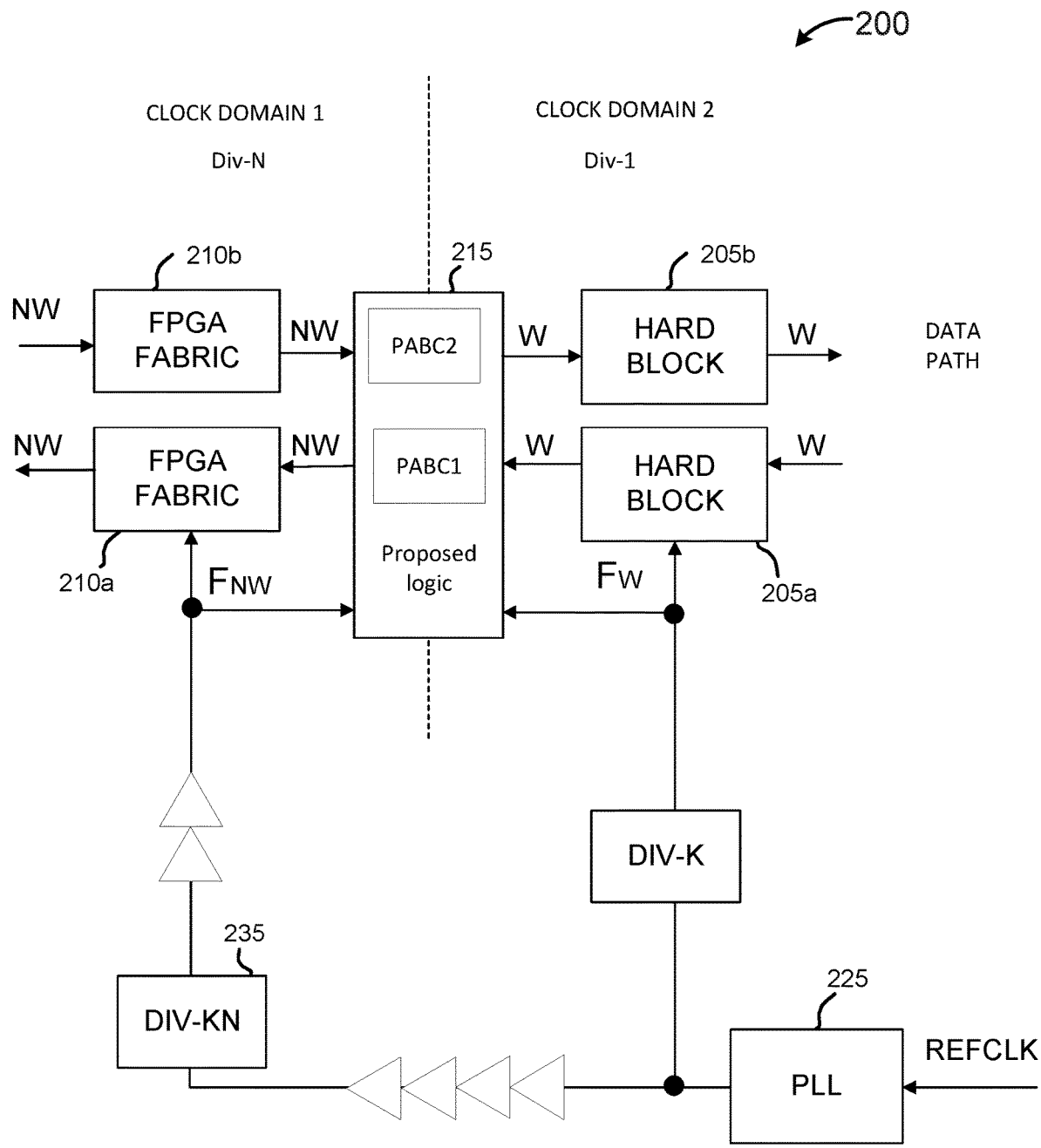
FIG. 2 depicts a block diagram of exemplary data paths for Div-1 to Div-N and Div-N to Div-1.

FIG. 2 depicts a block diagram of exemplary data paths for Div-1 to Div-N and from Div-N to Div-1. A first clock domain has a first frequency $F_{NW}$, and a second clock domain has a second frequency $F_W$. The frequency relationship between the first clock domain and the second clock domain is $F_W=N*F_{NW}$. Therefore, to ensure the same data transfer rate, bit width relationship between the two clock domains is the first clock domain has a bit width that is N times of the second clock domain.

In accordance with various embodiments, Div-1 to Div-N means the frequency relationship between a launch flop and a capture flop is N:1, and the bit width relationship between the launch flop and the capture flop is 1:N. In accordance with various embodiments, Div-N to Div-1 means the frequency relationship between a launch flop and a capture flop is 1:N and the bit width relationship between the launch flop and the capture flop is N:1. In this depicted example, as shown in a data transfer block diagram 200, data transferred from a hard block 205a of the second clock domain to a fabric 210a of the first clock domain is called Div-1 to Div-N. Data transferred from a fabric 210b of the first clock domain to hard block 205b of the second clock domain is called Div-N to Div-1. A proposed logic 215 is used to perform a phase alignment between the first clock domain and the second clock domain. More specifically, a first phase alignment beacon circuit (PABC1) is used for data transfer from Div-1 to Div-N and a second phase alignment beacon circuit (PABC2) is used for data transfer from Div-N to Div-1. An example of the PABC1 is described in further detail with reference to FIG. 3 and an example of the PABC2 is described in further detail with reference to FIG. 4. The first frequency $F_{NW}$ is obtained by dividing a phase-lock loop (PLL) 225 output clock signal by KN times. In this depicted example, a KN times divider DIV-KN 235 is used, K may be any positive integers, N may be any positive integers, for example, N may be 1, 2, 3 or 4. The second frequency $F_W$ is obtained by dividing the PLL 255 output clock signal by K. In this depicted example, a K time divider DIV-K is used. An example of the PABC1 is described in further detail with reference to FIG. 3 and an example of the PABC2 is described in further detail with reference to FIG. 4.

Such data transfers may be handled in ASIC and FPGA designs. Some high-speed communication protocols, such as PCIe, CCIX and 25 GigE, for example, may implement L2/L3 layers in FPGA fabric and use hard transceivers for L1. Instead of running fabric and hard blocks at the same clock frequency, fabric logic may run at Div-2 clock frequency with double data width. For example, 25 Gbps cache coherent interconnect for accelerators (CCIX) may be supported by running 64b×390.625 MHz at the fabric and 32b×781.25 MHz at the transceiver hard block.

Figure 3:
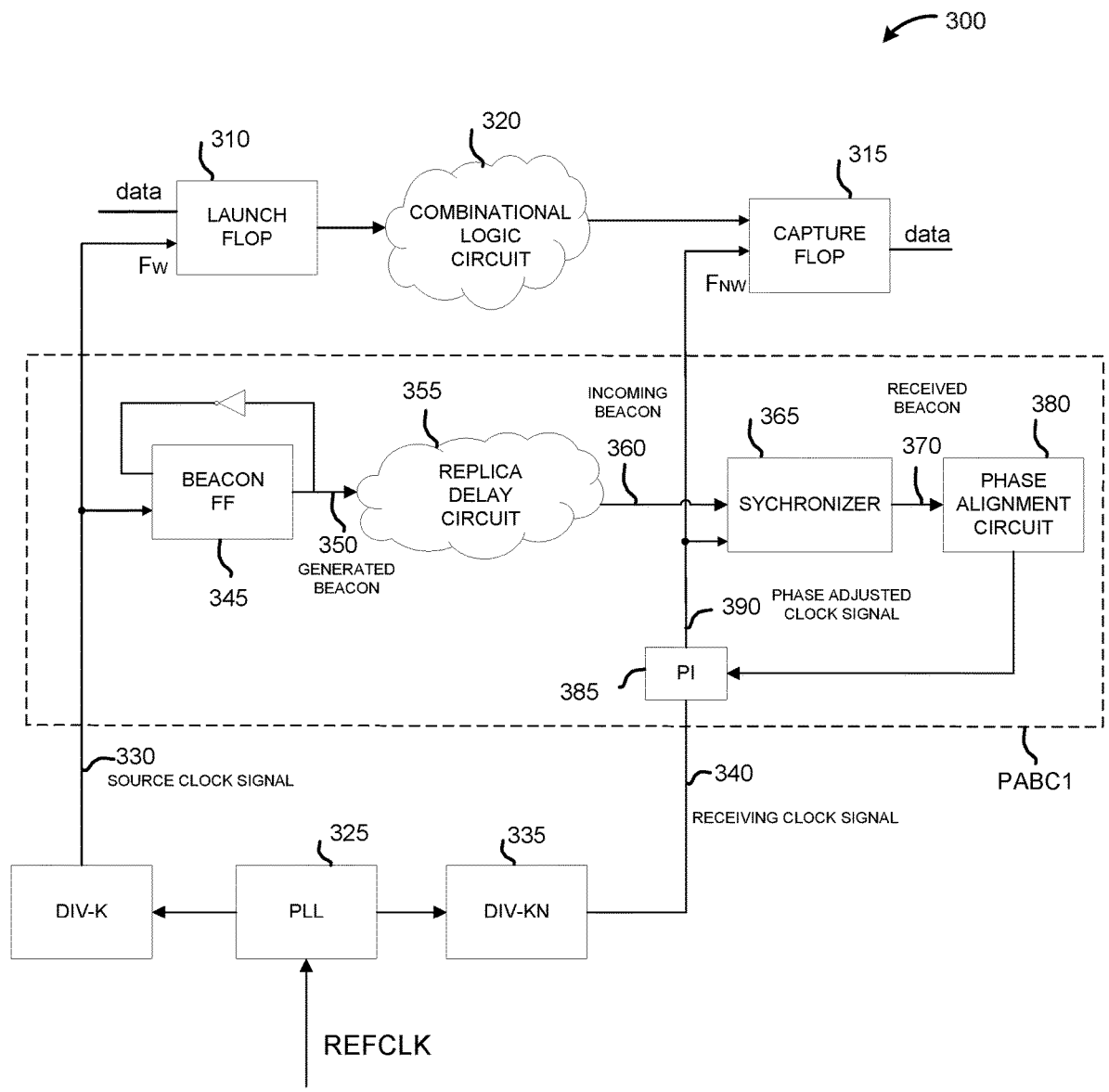
FIG. 3 depicts an exemplary electrical circuit for Div-1 to Div-N data transfer.

FIG. 3 depicts an exemplary electrical circuit for Div-1 to Div-N data transfer. An electrical circuit 300 can be used to transfer data across Div-1 to Div-N, where N=1, 2, 3, 4 etc. The electrical circuit 300 includes a launch flop 310 to transmit data, a capture flop 315 to receive data, and a combinational logic circuit 320 to fulfill a predetermined logic function. The frequency relationship for the data transfer is that a transmitted data has a frequency $F_W$, and a received data has a frequency $F_{NW}$, where N=1, 2, 3, 4 etc. $F_W=NF_{NW}$, for example, when data transferred from Div-1 to Div-2, the transmitted data may have a frequency $F_1$, and the received data may have a frequency $F_2$, $F_1=2F_2$. A clock circuit is used to feed the data path circuit. In this depicted example, the clock circuit includes a phase-lock loop (PLL) 325, a first frequency divider DIV-K configured to the PLL 325 to generate a source clock signal 330, and a KN times frequency divider DIV-KN 335 configured to the PLL 325 to generate a receiving clock signal 340.

To align the transmitted and received data with mesochronous divided frequencies, the first phase aligning beacon circuit (PABC1) is used. The PABC1 includes a beacon path circuit used as a data path representative, and a phase alignment circuit and a phase interpolator used to find and control the alignment. The beacon path circuit includes a beacon flip flop (FF) 345 receiving the source clock signal 330, a replica delay circuit 355 is coupled to the output of the beacon FF 345, and a synchronizer 365 is configured to the replica delay circuit 355 to generate a received beacon signal 370. In this depicted example, a combinational logic delay introduced by the combinational logic circuit 320 is matched by a replica delay introduced by the replica delay circuit 355.

The beacon FF 345 is driven by the source clock signal 330. The beacon FF 345 may be triggered by a positive edge of the source clock signal 330 or the beacon FF 345 may be triggered by a negative edge of the source clock signal 330. In this depicted example, the beacon FF 345 may be triggered by a positive edge of the source clock signal 330. After being processed by the beacon FF 345, the source clock signal 330 becomes a generated beacon signal 350. Similar to the data path delay, the generated beacon signal 350 passes through the replica delay circuit 355 and a replica logic delay is added to generate an incoming beacon signal 360. The incoming beacon signal 360 is received by the synchronizer 365 to generate the received beacon signal 370. The received beacon signal 370 is a representative of the data generated by the capture flop 315.

The phase alignment circuit 380 may be used to move the source clock 330 or the receiving clock 340 to achieve a phase alignment. Whether the receiving clock signal 340 or the sourcing clock signal 330 is selected based on different design topologies and other considerations. Here, for example, the receiving clock signal 340 is selected to move by adjusting the phase interpolator 385. The phase interpolator 385 is configured to receive a digital command signal from the phase alignment circuit 380 to adjust the phase of the receiving clock signal 340. The phase adjusted clock signal 390 is fed to the capture flop 315 and the synchronizer 365. A phase relationship between the incoming beacon signal 360 and the phase adjusted clock signal 390 are monitored by the phase alignment circuit 380.

In some embodiments, the phase interpolator 385 may be configured to move the source clock signal 330. In some embodiments, the phase alignment circuit 380 may send a digital command signal to the phase interpolator 385, and the phase interpolator 385 may be coupled to the sourcing clock signal 330 to allow the phase of the sourcing clock signal 330 to be fine adjusted. The phase adjusted sourcing clock signal may be fed to the launch flop 310 and the beacon FF 345.

An example of the phase alignment circuit 380 is described in further detail with reference to FIG. 5.

Figure 4:
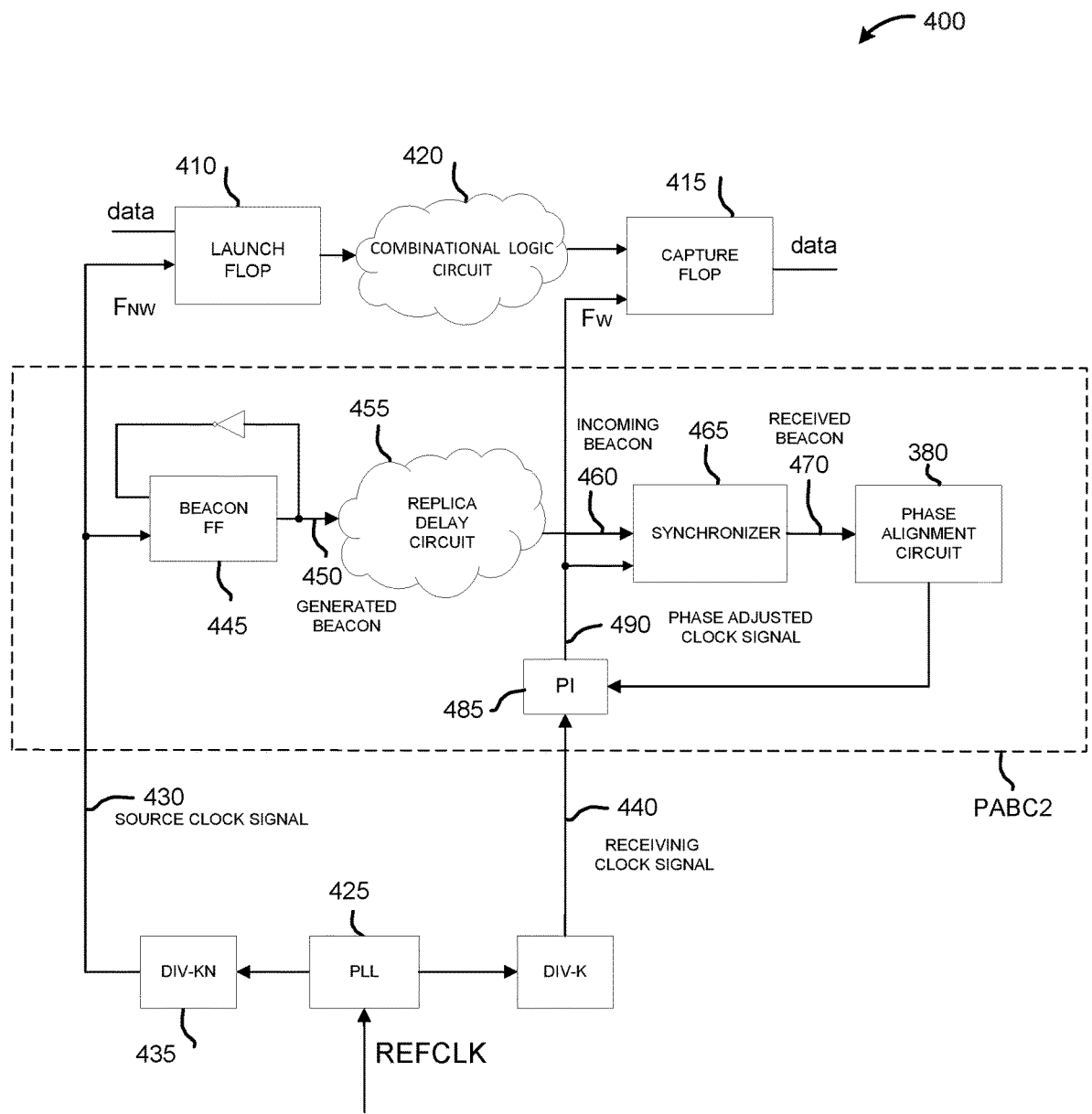
FIG. 4 depicts an exemplary electrical circuit for Div-N to Div-1 data transfer.

FIG. 4 depicts an exemplary electrical circuit for Div-N to Div-1 data transfer. Similar reference numbers in FIG. 4 and FIG. 3 have similar meanings. An electrical circuit 400 can be used to transfer data across mesochronous Div-N to Div-1, where N=1, 2, 3, 4 etc. The electrical circuit 400 includes a launch flop 410 to transmit data, a capture flop 415 to receive data, and a combinational logic circuit 420 to fulfill a predetermined logic function. The frequency relationship for the data transfer is that the transmitted data has a frequency $F_{NW}$, and the received data has a frequency $F_W$, where N=1, 2, 3, 4, etc. $F_w=N*F_{NW}$, for example, when data transferred from Div-1 to Div-2, the transmitted data may have a frequency $F_1$, and the received data may have a frequency $F_2$, $F_1=2F_2$. A clock circuit is used to feed the data path circuit. In this depicted example, the clock circuit includes a phase-lock loop (PLL) 425, a KN times frequency divider DIV-KN 435 configured to the PLL 425 to generate a source clock signal 430, and a K times frequency divider DIV-K configured to the PLL 425 to generate a receiving clock signal 440.

To align the transmitted and received data with mesochronous divided frequencies, the second phase aligning beacon circuit (PABC2) is used. The PABC2 includes a beacon path circuit used as a data path representative, and the phase alignment circuit 380 and a phase interpolator used to find and control the alignment. The beacon path circuit includes a beacon flip flop (FF) 445 receiving a source clock signal 430, a replica delay circuit 455 coupled to the output of the beacon FF 445, and a synchronizer 465 is configured to the replica delay circuit 355 to generate a received beacon signal 470. In this depicted example, a combinational logic delay introduced by the combinational logic circuit 420 is matched by a replica delay introduced by the replica delay circuit 455.

The beacon FF 445 is driven by the source clock signal 430. The beacon FF 445 may be triggered by a positive edge of the source clock signal 330 or the beacon FF 445 may be triggered by a negative edge of the source clock signal 430. In this depicted example, the beacon FF 445 may be triggered by a positive edge of the source clock signal 430. After being processed by the beacon FF 345, the source clock signal 430 becomes a generated beacon signal 450. Similar to the data path delay, the generated beacon signal 450 passes through the replica delay circuit 455 and a replica logic delay is added to generate an incoming beacon signal 460. The incoming beacon signal 460 is received by the synchronizer 465 to generate the received beacon signal 470. The received beacon signal 470 is a representative of the data generated by the capture flop 415.

The phase alignment circuit 380 may be used to move the source clock 430 or the receiving clock 440 to achieve a phase alignment. Whether the receiving clock signal 440 or the sourcing clock signal 430 is selected based on different design topologies and other considerations. Here, for example, the receiving clock signal 440 is selected to move by adjusting the phase interpolator 485. The phase interpolator 485 is configured to receive a digital command signal from the phase alignment circuit 380 to adjust the phase of the receiving clock signal 440. The phase adjusted clock signal 490 is fed to the capture flop 415 and the synchronizer 465. A phase relationship between the incoming beacon signal 460 and the phase adjusted clock signal 490 are monitored by the phase alignment circuit 380.

In some embodiments, the phase interpolator 485 may be configured to move the source clock signal 430. In some embodiments, the phase alignment circuit 380 may send a digital command signal to the phase interpolator 485. The phase interpolator 485 may be coupled to the sourcing clock signal 430 to allow the phase of the sourcing clock signal 430 to be adjusted to achieve a phase alignment. The phase adjusted sourcing clock signal may be fed to the launch flop 410 and the beacon FF 445.

An example of the phase alignment circuit 380 is described in further detail with reference to FIG. 5.

Figure 5:
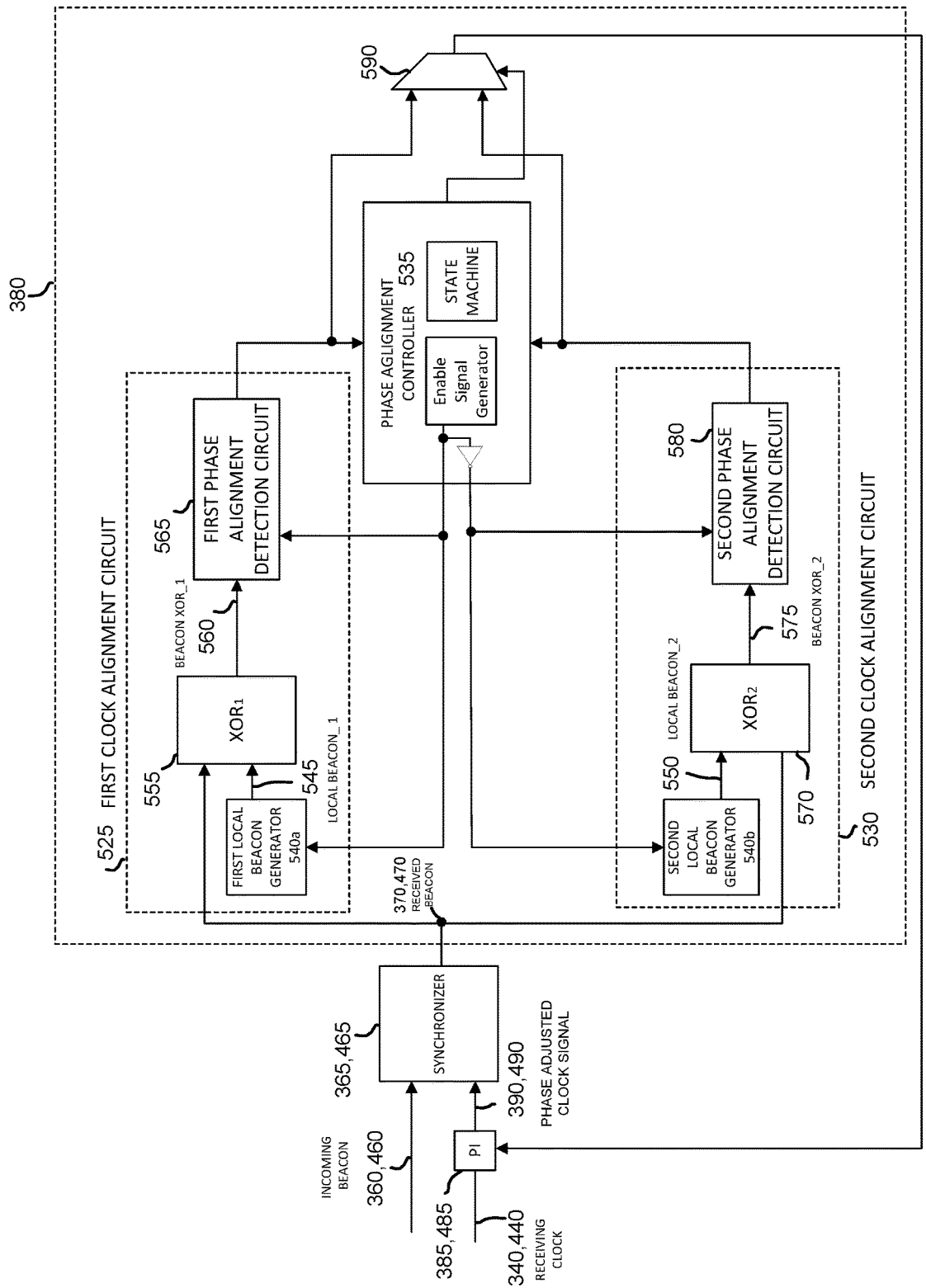
FIG. 5 depicts an exemplary phase alignment circuit used in FIG. 3 and FIG. 4.

FIG. 5 depicts an exemplary phase alignment circuit used in FIG. 3 and FIG. 4. For data transferred between Div-N and Div-1, N phase alignment detection circuits may be used to detect a phase alignment. A phase alignment controller may be configured to enable and control the N phase alignment detection circuits. The phase alignment controller may include an enable signal generator and a state machine. The enable signal generator may generate an enable signal that toggles constantly to enable those N phase alignment detection circuits alternately. The state machine may be configured to select the phase alignment detection circuit which may find an alignment first to control a phase interpolator. For example, for a Div-4 to Div-1 data transfer, four phase alignment detection circuits may be used to find the alignment. In some embodiments, N XOR gates and corresponding N local beacon signals may be used together with the N phase alignment detection circuits to further speed the alignment. The N local beacon signals may be generated by one or more local beacon generators. The phase alignment controller may be configured to enable and control the N local beacon generators.

This depicted example shows data transferred from Div-2 to Div-1. Therefore, two phase alignment detection circuits are used. Two local beacon signals and corresponding two XOR gates are also used to further speed the alignment. A phase alignment detection circuit, a local beacon generator and a corresponding XOR gate are called a clock alignment circuit here. More specifically, in this depicted example, the phase alignment circuit 380 includes a first clock alignment circuit 525, a second clock alignment circuit 530, and a phase alignment controller 535. The first clock alignment circuit 525 and the second clock alignment circuit 530 are both designed to find an alignment between the incoming beacon 360,460 and the phase adjusted clock signal 390, 490. The purpose of having two clock alignment circuits is potentially to speed up alignment, by choosing the clock alignment circuit that indicates an alignment first.

In this depicted example, the first clock alignment circuit 525 includes an XOR gate 555. The XOR gate 555 generates a signal, i.e., beacon XOR_1 signal illustrated in FIG. 5, in response to the received beacon signal 370,470 and a first local beacon signal 545. By controlling phase of the first local beacon signal 545 and phases of the phase adjusted clock signal 390,490 and/or the phase of the incoming beacon signal 360,460, the beacon XOR_1 signal could become a stable value that could be monitored to reflect a phase relationship between the phase adjusted clock signal 390,490 and the incoming beacon signal 360,460. For example, a stable 0 may mean push the phase adjusted clock signal 390,490 to left and a stable 1 may mean push the phase adjusted clock signal 390, 490 to right. In this depicted example, the first clock alignment circuit 525 also includes a first phase alignment detection circuit 565 that could find a first alignment point when the stable beacon XOR_1 signal becomes unstable.

In this depicted example, the second clock alignment circuit 530 includes an XOR gate 570. The XOR gate 570 generates a signal, i.e., beacon XOR_2 signal illustrated in FIG. 5, in response to the received beacon signal 370,470 and a second local beacon signal 550. By controlling phase of the second local beacon signal 550 and phases of the phase adjusted clock signal 390,490 and/or the phase of the incoming beacon signal 360,460, the beacon XOR_2 signal could become a stable value that could be monitored to reflect a phase relationship between the phase adjusted clock signal 390,490 and the incoming beacon signal 360,460. In this depicted example, the second clock alignment circuit 530 also includes a second phase alignment detection circuit 580 that could predict a second alignment point based on the stable beacon XOR_2 signal.

The phase alignment controller 535 is used to enable the first clock alignment circuit 525 and the second clock alignment circuit 530 by sending a constantly toggling enabling signal to the first clock alignment circuit 525 and the second clock alignment circuit 530. The phase alignment controller 535 is also used to select one from the first clock alignment circuit 525 and the second clock alignment circuit 530 to control the phase interpolator 385,485. By enabling one or more clock alignment circuits (e.g., the clock alignment circuits 525,530), the phase alignment circuit 380 could be used to align phases with different frequency relationships.

In some embodiments, the phase alignment controller 535 may include an enable signal generator and a state machine. The enable signal generator may generate the enable signal that alternately enables the first clock alignment circuit 525 and the second clock alignment circuit 530. The state machine may be used to generate a command signal to select a primary clock alignment circuit between the first clock alignment circuit 525 and the second clock alignment circuit 530 to control the phase interpolator 485. In some embodiments, an N-input 1-output multiplexer may be controlled by the state machine to perform the selection. In this depicted example, a multiplexer 590 having two inputs is used, the two inputs are coupled to the first clock alignment circuit 525 and the second clock alignment circuit 530 and output a primary digital command signal in response to the primary clock alignment circuit selected by the state machine.

Variations and configurations of the first local beacon signal 545 and the second local beacon signal 550 make the phase alignment circuit 380 configurable for phase alignment in a Div-1 to Div-1 data transfer circuit, a Div-2 to Div-1 data transfer circuit, and a Div-1 to Div-2 data transfer circuit.

In an illustrative example, the phase alignment circuit (e.g., the phase alignment circuit 380) may be used in a Div-1 to Div-1 data transfer circuit. A Div-1 to Div-1 data transfer circuit may have a similar circuit as the Div-1 to Div-N data transfer circuit in FIG. 3 or the Div-N to Div-1 data transfer circuit in FIG. 4, except that the frequency relationship is 1:1 instead of 1:N or N:1. In this situation, only one clock alignment circuit need be enabled by the phase alignment controller 535 to find an alignment point between the receiving clock signal and the incoming beacon signal. For example, only the first clock alignment circuit 525 may be enabled. The polarity of the received beacon transitions alternates on successive rising edges of the receiving clock. Therefore, the first clock alignment circuit 525 is further configured to receive the first local beacon signal 545 that has a frequency which is half of the receiving clock signal to eliminate the alternation and to generate a stable value that is easy to monitor to detect a phase relationship between the incoming beacon signal and the phase adjusted receiving clock signal and find the alignment point. By monitoring a phase relationship between the incoming beacon signal and the phase adjusted receiving clock signal, an alignment point may be determined by the phase alignment controller 535, and then a digital command signal may then be generated by the phase alignment controller 535 and sent to the phase interpolator.

The phase alignment circuit may also be used in a Div-1 to Div-N data transfer circuit (e.g., the phase alignment circuit 380 is used in a Div-1 to Div-2 data transfer circuit in FIG. 3). For this 1:N case, only one clock alignment circuit is needed to find an alignment point, for example, the first clock alignment circuit 525 is enabled by the phase alignment controller 535. When the receiving clock signal 340 starts to sample the incoming beacon signal 360, the first phase alignment detection circuit 565 of the first clock alignment circuit 525 may see an unchanging received beacon signal when N is an even number. Therefore, the stable received beacon signal may reveal the phase relationship between the incoming beacon signal 360 and the phase adjusted clock signal 390. Therefore, beacon-XOR signal and local beacon signal are no longer needed by the XOR gate to obtain a stable indicator. In some embodiments, the phase alignment circuit (e.g., the phase alignment circuit 380) including one or more local beacon generators and XOR gates may be configured to use when N is an even number. For example, the first local beacon signal 545 may be configured to 0 to make the beacon XOR_1 signal the same to the received beacon signal 370,470. When the receiving clock signal 340 starts to sample the incoming beacon signal 360, the first phase alignment detection circuit 565 of the first clock alignment circuit 525 may see an alternating received beacon signal when N is an odd number. Therefore, beacon-XOR signal and a local beacon signal are needed by the XOR gate to obtain a stable indicator. In some embodiments, the local beacon signal used by the XOR gate may be controlled to have the same frequency with the received beacon signal.

The phase alignment circuit may also be used in a Div-N to Div-1 data transfer circuit (the phase alignment circuit 380 may be used in a Div-2 to Div-1 data transfer circuit), as FIG. 4 illustrated, for example. As sampled received beacon signal may alternate for all Div-N to Div-1 cases, in some embodiments, a local beacon signal and an XOR gate may be needed to transfer the received beacon signal into a stable value. Here, an example for a 2:1 case is discussed for simplicity. In this 2:1 case, two clock alignment circuits (e.g., the first clock alignment circuit 525 and the second clock alignment circuit 530) are used to accelerate the phase alignment. The receiving clock signal 440 has a frequency that is four times the incoming beacon signal 460. In this situation, both the first clock alignment circuit 525 and the second clock alignment circuit 530 are enabled.

By monitoring a polarity relationship between the received beacon signal 470 and the first local beacon signal 545, a first alignment point may be determined by the phase alignment controller 535. By monitoring a polarity relationship between the received beacon signal 470 and the second local beacon signal 550, a second alignment point may be determined by the phase alignment controller 535. In some embodiments, both the first local beacon signal 545 and the second local beacon signal 550 may be controlled to have the same frequency with the received beacon signal 470. The polarity may indicate whether or not the received beacon signal 470 and the local beacon signals 545,550 match at the rising edge. The phase alignment controller 535 may then select the first phase alignment detection circuit 565 that finds the alignment point earlier (e.g., the first circuit to see a polarity change) to control the phase interpolator 485.

For the Div-N to Div-1 data transfer, as sampled received beacon signal may alternate for all Div-N to Div-1 cases, in some embodiments, in a clock alignment circuit (e.g., the first clock alignment circuit 525), a local beacon signal and an XOR gate may be not needed when the phase alignment controller (e.g., the phase alignment controller 535) uses only alternating received beacon signal samples. This may take more time to accumulate a given number of received beacon signal samples (e.g., take twice as long for a Div-2 to Div-1 case).

Figure 6:
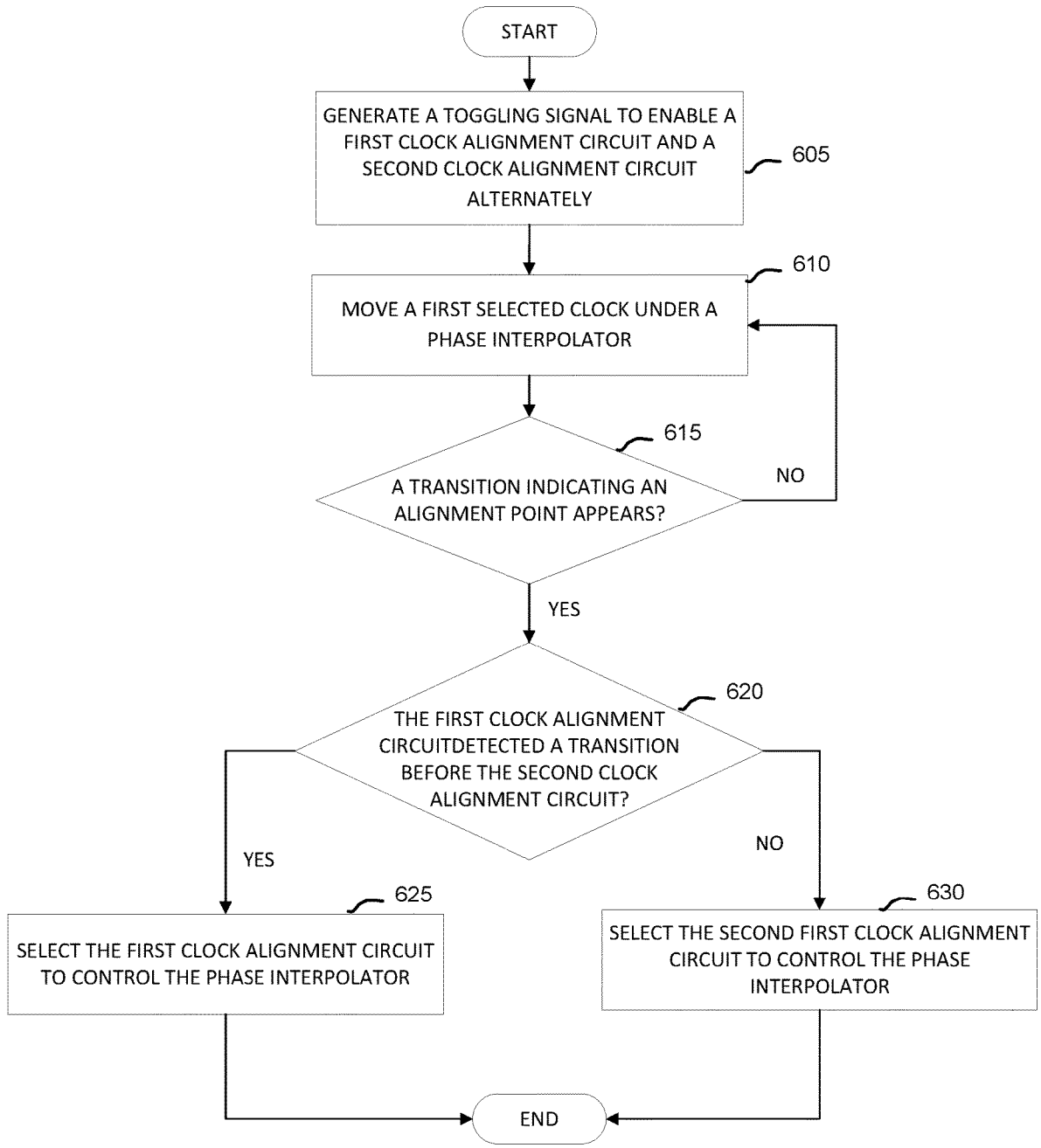
FIG. 6 depicts a flow chart of an exemplary phase alignment method used in FIG. 4.

FIG. 6 depicts a flow chart of an exemplary phase alignment method used in FIG. 4.

As discussed earlier, for the Div-N to Div-1 data transfer, when N is larger than 1, N clock alignment circuits may be used to find an alignment point faster. N local beacon signals and corresponding XOR gates in the N clock alignment circuits are optional. In some embodiments, N local beacon signals and corresponding XOR gates may be used to further accelerate the alignment. In some embodiments, N local beacon signals and corresponding XOR gates may be omitted to achieve a simpler circuitry. In this depicted example, the method is explained when N=2 for simplicity. Therefore, two clock alignment circuits (e.g., the first clock alignment circuit 525 and the second clock alignment circuit 530) are used in this depicted example. The method includes providing a received beacon signal in response to an incoming beacon signal and a phase adjusted receiving clock signal, the phase adjusted receiving clock signal having a frequency that is four times the received beacon signal when N=2.

In this depicted example, two local beacon signals and corresponding XOR gates are used to further accelerate the alignment. In step 605, a toggling signal is provided to alternately enable the first clock alignment circuit 525 and the second clock alignment circuit 530. The method also includes, in step 610, moving a selected clock signal (e.g., the sourcing clock signal 430 or the receiving clock signal 440) under a phase interpolator (e.g., the phase interpolator 485). A first phase alignment detection circuit (e.g., the first phase alignment detection circuit 565) detects a first alignment point between the first local beacon signal and the received beacon signal and a second phase alignment detection circuit (e.g., the second phase alignment detection circuit 580) detects a second alignment point between the second local beacon signal and the received beacon signal. The first local beacon signal, the second local beacon signal, and the received beacon signal have the same frequency. In step 615, the selected clock signal is moved until either the first phase alignment detection circuit (e.g., the first phase alignment detection circuit 565) or the second phase alignment detection circuit (e.g., the second phase alignment detection circuit 580) find an alignment point indicated by a change in a stable signal (e.g., the beacon XOR_1 signal 560 or the beacon XOR_2 signal 575).

In step 620, the method also includes selecting the one having the faster alignment point as a primary clock alignment circuit to control the phase interpolator (e.g., the phase interpolator 485). As illustrated in step 625 and step 630, one of the first clock alignment circuit and the second clock alignment circuit is selected to control the phase interpolator.

Figure 7:
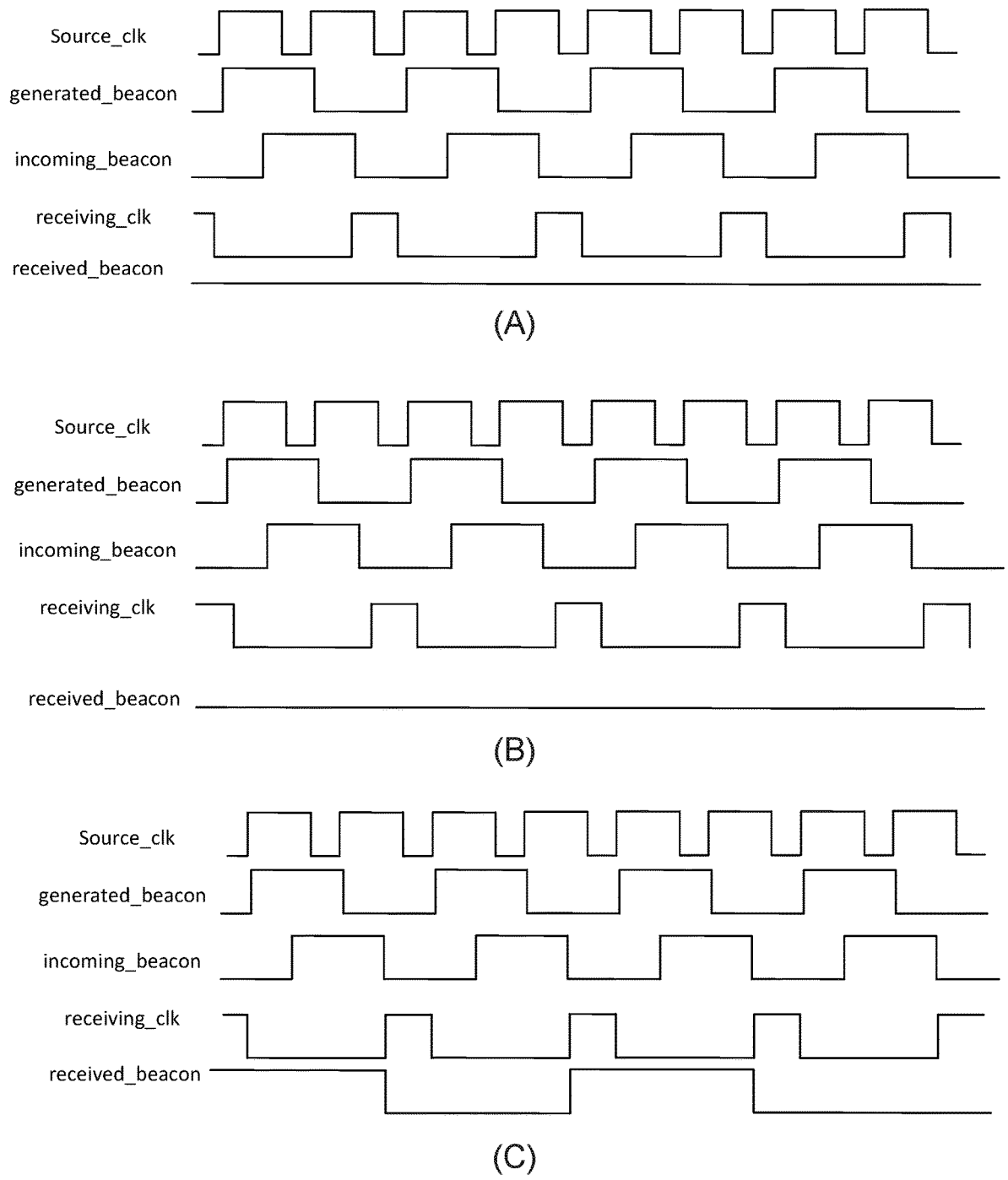
FIG. 7 depicts exemplary timing diagrams for clock signals of FIG. 3.

FIG. 7 depicts exemplary timing diagrams for clock signals of FIG. 3. With reference to FIG. 5, no local beacon signal is needed for Div-1 to Div-N cases when N is an even number. Here, a 1:2 case is simulated for simplicity. The sourcing clock 330 is twice as fast as the receiving clock 340. FIG. 7(A) is an example in which the rising edges of the receiving clock 340 are just early with respect to changing edges of the incoming beacon signal 360. FIG. 7(B) is an example in which the rising edges of the receiving clock 340 are just late with respect to changing edges of the incoming beacon signal 360. FIG. 7(C) is an example in which the rising edges of the receiving clock signal 340 are just aligned with changing edges of the incoming beacon signal 360. When the incoming beacon signal 360 and the receiving clock signal 340 are aligned, the received beacon signal 370 toggles randomly.

Figure 8:
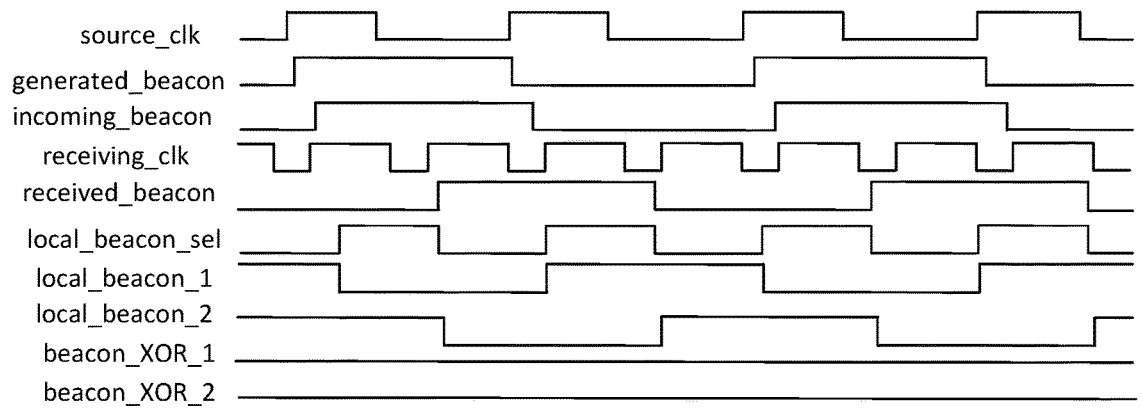
FIG. 8 depicts exemplary timing diagrams for clock signals of FIG. 4.
Figure 8:
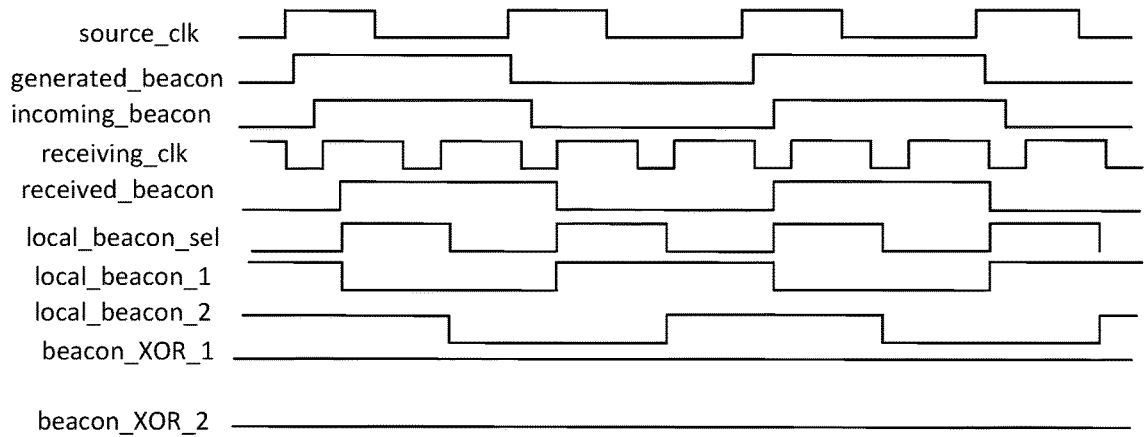
Figure 8:
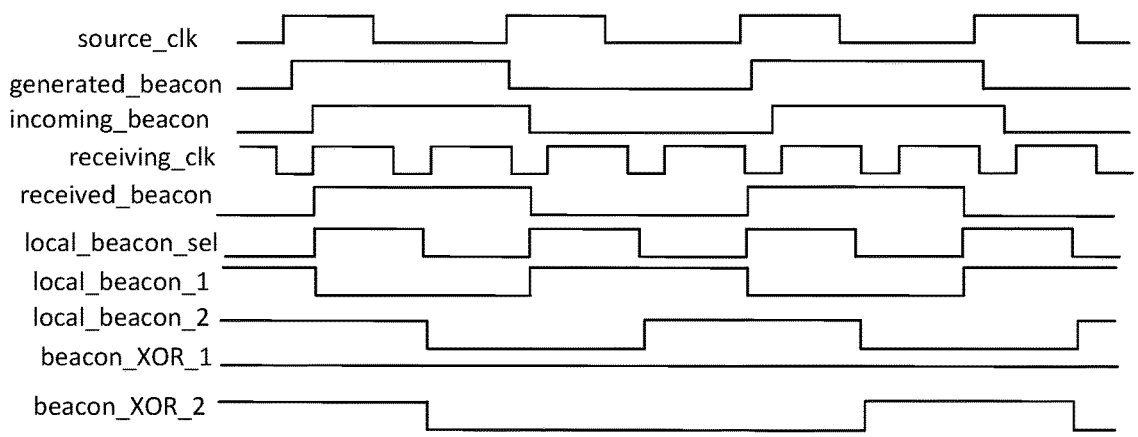

FIG. 8 depicts exemplary timing diagrams for clock signals of FIG. 4. Here, a 2:1 case is simulated for simplicity, the receiving clock 440 is twice as fast as the sourcing clock 430. As discussed in FIG. 5, two local beacon signals may be used to accelerate the phase alignment process for Div-2 to Div-1 cases. In this depicted example, two local beacon signals are used to show the phase alignment process. Both the first clock alignment circuit 525 and the second clock alignment circuit 530 are enabled to generate a first beacon XOR signal and a second beacon XOR signal. FIG. 8(A) is an example in which the rising edges of the receiving clock 440 are just early with respect to changing edges of the incoming beacon signal 460. FIG. 8(B) is an example in which the rising edges of the receiving clock 440 are just late with respect to changing edges of the incoming beacon signal 460. FIG. 8(C) is an example in which the rising edges of the receiving clock signal 440 are just aligned with changing edges of the incoming beacon signal 460. When the incoming beacon signal 460 and the receiving clock signal 440 are aligned, a beacon XOR signal change from a stable status to a toggling status. Here, a second beacon XOR signal is changed because the second clock alignment circuit 530 is selected as the primary clock alignment circuit that has a faster alignment point than the first clock alignment circuit 525 in FIG. 5.

After an initial phase alignment between two signals is achieved, phases of these two signals may be further processed to achieve a balanced setup/hold margin regardless of a duty cycle distortion DCD. This processed phase relationship may be further maintained independent of environment and temperature change. In various embodiments, improved phase adjustment may advantageously, for example, facilitate data integrity between clock domain operating with different frequencies.

FIG. 9 depicts exemplary electrical circuits configured to perform data transfers and maintain a good phase alignment in a single lane. More specifically, FIG. 9 includes an electrical circuit 900 used for data transmitting and data receiving with good phase alignment maintenance. The electrical circuit 900 includes a first clock domain and a second clock domain. A data path circuit 901 between the first clock domain the second clock domain is shown in FIG. 9. The first clock domain is fed by a first clock signal 905, and the second clock domain is fed by a second clock signal 910. Frequency relationships between the first and the second clock domains may be 1:N, N:1 or 1:1, where N may be any positive integer.

The electrical circuit 900 also includes a first interpolator 915 used to shift the phase of the first clock signal 905, and a second interpolator 920 used to shift the phase of the second clock signal 910. The first clock signal 905 and the second clock signal 910 function as the sourcing clock signal 330,430 or the receiving clock signal 340,440 in FIG. 5, which depends on whether the electrical circuit 900 is used for data transmitting or data receiving.

The electrical circuit 900 also includes a first beacon path circuit 925. The data path 901 is matched and represented by a first beacon path circuit 925. By monitoring the first beacon path circuit 925, the first phase interpolator 915 and/or the second phase interpolator 920 are used to achieve an initial alignment, for example, the initial alignment between the phase adjusted clock signal 390,490 and the incoming beacon signal 360,460 as discussed in FIG. 5. In this depicted example, the initial alignment refers to rising edges of the receiving clock signal aligns with rising edges of the incoming beacon signal. In various embodiments, the initial alignment may refer to the falling edges of the receiving clock signal aligns with toggling edges of the incoming beacon signal. After the initial alignment is achieved, the phase of the phase adjusted clock signal 390,490 is rotated by 180 degrees of a faster clock of the receiving clock signal 340,440 and the sourcing clock signal 330,430 by using the first phase interpolator 915 and/or the second phase interpolator 920.

After the 180 degree phase rotation, there may be no edge alignment that could be used to maintain a desired alignment between the data path circuit 901 and the first/second clock signal 905/910. The electrical circuit 900 also includes a second beacon path circuit 930. The second beacon path circuit 930, controlled by a third phase interpolator 935, may be operated as needed to achieve a maintainable edge alignment. The rising/falling edge of the receiving clock signal comes midway between edges of data, optimally aligned for equal setup and hold times. This optimal alignment does not depend on good clock duty cycle or on timing of falling/rising edges. In order to keep the ideal alignment, the third phase interpolator 935 is shut off after this ideal alignment is achieved, and the second beacon path circuit 930 is continuously monitored.

In some embodiments, the first clock signal 905 and the second clock signal 910 may already have good duty cycle before the 180 degree shift. Therefore, it may be possible to perform a negative edge alignment without any need for the 180 degree shift. Negative edge alignment may significantly speedup the alignment process. The negative edge alignment may be performed by various ways. For example, when the second clock signal 910 is the faster clock compared to the first clock signal 905, a beacon FF (e.g., the beacon FF 445 in FIG. 4) may be triggered by a positive edge of the first clock signal 905 and a synchronizer (e.g., the synchronizer 465 in FIG. 4) may be triggered by a negative edge of the second clock signal 910. For example, when the first clock signal 905 is the faster clock compared to the second clock signal 910, a beacon FF (e.g., the beacon FF 445 in FIG. 4) may be triggered by a negative edge of the first clock signal 905 and a synchronizer (e.g., the synchronizer 465 in FIG. 4) may be triggered by a positive edge of the second clock signal 910.

External voltages and temperatures change over time, δ in FIG. 9 represents some external voltages and temperatures changes 940. δ will affect the timing in both the first beacon path circuit 925 and the second beacon path circuit 930. By shutting off the third phase interpolator 935 and monitoring the second beacon path circuit 930, the second phase interpolator 920 may be adjusted to bring the second beacon path circuit 930 back to the proper timing relationship after the change. Once this happens, it will also adjust the data path circuit 901. In this way, the second beacon path circuit 930 can be used continuously to keep the ideal phase relationships.

FIG. 10 depicts a flow chart of an exemplary process to maintain an aligned phase relationship. The method includes, at 1010, selecting a clock signal (e.g., the first clock signal 905 or the second clock signal 910 in FIG. 9) to shift to achieve an initial phase alignment in a first beacon path (e.g., the first beacon path circuit 905 in FIG. 9). In some embodiments, this initial phase alignment may be achieved by applying the method discussed in FIGS. 5-6. In some embodiments, this initial phase alignment may be performed by operating a first phase interpolator (e.g., the first phase interpolator 915 in FIG. 9) and/or a second phase interpolator (e.g., the second phase interpolator 925 in FIG. 9).

After the initial phase alignment in the first beacon path (e.g., the first beacon path 905) is achieved, at 1020, the selected clock signal is shifted by 180 degree of the faster clock between the first clock signal (e.g., the first clock signal 905) and the second clock signal (e.g., the second clock signal 910) to obtain an ideal alignment with a good setup and hold margin phase relationship. After the 180 degree phase shift, in some cases, there may no valid alignments that could be used to maintain a desired alignment between the data path circuit 901 and the first/second clock signal 905/910.

Then, at 1030, a third phase interpolator (e.g., the phase interpolator 935) may be operated to control a second beacon path (e.g., the second beacon path 930) and to create an edge alignment that may be used to maintain the ideal alignment.

When the ideal alignment is obtained, at 1040, the third phase interpolator (e.g., the phase interpolator 935) may be shut off and may be monitored the second beacon path (e.g., the second beacon path 930). Because of changing conditions, for example, topology, voltage, temperature, etc. A delay may be introduced to both the data path (e.g., the data path 901) and the second beacon path (e.g., the second beacon path 910).

At 1050 and 1060, the phase relationship may be dynamically adjusted to bring the second beacon path back to the ideal alignment. Therefore, this dynamic adjustment also changes the data path (e.g., the data path 901) synchronously. In this way, this method provides the second beacon path (e.g., the second beacon path 930) which is ready to use continuously to keep the ideal alignment.

Although various embodiments have been described with reference to the figures, other embodiments are possible. For example, in a multiple-lane circuit, two close lanes may share a phase interpolator to save both cost and size. In various embodiments, a second phase interpolator of a third lane may be used as a third phase interpolator that cooperates with a first and a second phase interpolator of a second lane.

In various examples, other logic gates and circuits may be used by the first clock alignment circuit and/or the second clock alignment circuit to find an alignment point. Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, the method used to align phases for Div-N to Div-1 may also work with a single local beacon. The purpose of having two local beacons is potentially to speed up alignment, by choosing the local beacon that indicates an alignment first. Here's an example of how to interpret the beacon XOR indicator. Supposing a source clock is slightly slowed down so that its edges are more and more delayed with respect to receiving clock edges. Suppose the beacon XOR remains "1" for a significant period of time. Therefore, "1" may indicate a stable value for the beacon's current phase. Continuing to move the beacon phase to the right, at some point, it switches to 0, or perhaps starts toggling randomly. That is the point where two phases are aligned. Accordingly, "1" will mean the beacon should be moved to the right, or that the receiving clock phase should be moved to the left; and 0 will mean the beacon should be moved to the left, or that the receiving clock phase should be moved to the right.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs). In some embodiments, the module(s) may involve execution of preprogrammed instructions and/or software executed by a processor. For example, various modules may involve both hardware and software.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A system comprising:
a first clock alignment circuit configured to monitor a received beacon signal and generate a first command signal in response to a first detected phase alignment point between an incoming beacon signal and a first clock signal, wherein the received beacon signal is generated by a synchronizer in response to the incoming beacon signal and the first clock signal;
a second clock alignment circuit configured to monitor the received beacon signal and generate a second command signal in response to a second detected phase alignment point between the incoming beacon signal and the first clock signal; and,
a control circuit configured to, in response to a faster one of the first detected phase alignment point and the second detected phase alignment point, select a primary clock alignment circuit from the first clock alignment circuit and the second clock alignment circuit to output a corresponding command signal of the selected primary clock alignment circuit to control a phase interpolator,
wherein, the first clock signal is output by the phase interpolator configured to adjust a phase of a receiving clock signal in response to the selected command signal, the control circuit is further configured to generate a toggling enable signal to enable the first clock alignment circuit and the second clock alignment circuit alternately.

2. The system of claim 1, wherein the control circuit comprises an enable signal generator and a state machine, the enable signal generator is configured to generate the toggling enable signal, and the state machine is configured to control the selection of the command signal.

3. The system of claim 1, wherein the first clock alignment circuit further comprises:
a first local beacon generator configured to generate a first local beacon signal;
a first XOR gate configured to receive the received beacon signal and the first local beacon signal and generate a fourth signal; and
a first phase alignment detection circuit configured to detect the first phase alignment point and generate the first command signal in response to a first detected phase alignment point.

4. The system of claim 3, wherein the second clock alignment circuit further comprises:
a second local beacon generator configured to generate a second local beacon signal;
a second XOR gate configured to receive the received beacon signal and the second local beacon signal and generate a fifth signal; and,
a second phase alignment detection circuit configured to detect the second phase alignment point and generate the second command signal in response to the second detected phase alignment point.

5. The system of claim 1, further comprising the synchronizer circuit configured to generate the received beacon signal by sampling the incoming beacon signal in response to the first clock signal.

6. The system of claim 4, wherein when the system is used for a 1:2 data transfer, the first clock alignment circuit is selected as the primary clock alignment circuit, and the first local beacon signal is configured to 0.

7. The system of claim 4, wherein when the system is used for a 1:1 data transfer, the first clock alignment circuit is selected as the primary clock alignment circuit and the first local beacon signal and the second local beacon signal are configured to toggle at the same frequency with the received beacon signal.

8. The system of claim 4, wherein when the system is used for a 2:1 data transfer, the primary clock alignment circuit selected by the control circuit is the one with a faster phase alignment between the first phase alignment and the second phase alignment.

9. The system of claim 4, further comprising a 2-input multiplexer coupled to the first clock alignment circuit and the second clock alignment circuit and controlled by the control circuit to generate the selected command signal.

10. The system of claim 9, further comprising a phase interpolator coupled to the 2-input multiplexer to receive the selected command signal.

11. A phase alignment method, comprising:
providing a first clock alignment circuit to monitor a received beacon signal and generate a first command signal in response to a first detected phase alignment point between an incoming beacon signal and a first clock signal, wherein the received beacon signal is generated by a synchronizer in response to the incoming beacon signal and the first clock signal;
providing a second clock alignment circuit to monitor the received beacon signal and generate a second command signal in response to a second detected phase alignment point between the incoming beacon signal and the first clock signal;
generating, with a control circuit, an enable signal to enable the first clock alignment circuit and the second clock alignment circuit; and,
selecting, by the control circuit, a primary clock alignment circuit from the first and the second clock alignment circuits to output a corresponding a command signal of the selected primary clock alignment circuit to control a phase interpolator,
wherein, the selected primary clock alignment circuit is the one that detects a phase alignment point first, and the first clock signal is output by the phase interpolator configured to adjust a phase of a receiving clock signal in response to the selected command signal.

12. The method of claim 11, wherein the generation of the enable signal comprises: configuring an enable signal generator to generate a toggling signal to alternately enable the first clock alignment circuit and the second clock alignment circuit.

13. The method of claim 11, wherein the generation of the first command signal comprises:
generating, by a first local beacon generator, a first local beacon signal;
receiving, by a first XOR gate, the received beacon signal and the first local beacon signal to generate a fourth signal; and,
monitoring, by a first phase alignment detection circuit, the fourth signal to detect the first phase alignment point and generate the first command signal.

14. The method of claim 13, wherein the second clock alignment circuit further comprises:
- generating, by a second local beacon generator a second local beacon signal;
- receiving, by a second XOR gate, the received beacon signal and the second local beacon signal to generate a fifth signal; and,
- monitoring, by a second phase alignment detection circuit, the fifth signal to detect the second phase alignment point and generate the first command signal.

15. The method of claim 14, further comprising generating, with the synchronizer circuit, the received beacon signal by sampling the incoming beacon signal in response to the first clock signal.

16. The method of claim 14, wherein when the method is used for a 1:2 data transfer, further comprising:
- generating an enable signal to only enable the first clock alignment circuit; and,
- configuring the first local beacon signal to 0.

17. The method of claim 14, wherein, when the method is used for a 1:1 data transfer, further comprising: generating an enable signal to only enable the first clock alignment circuit and configuring the first local beacon signal to have a frequency that is twice a frequency of the first clock signal.

18. The method of claim 14, wherein when the method is used for a 2:1 data transfer, further comprising: generating a toggling enable signal to alternately enable the first clock alignment circuit and the second clock alignment circuit.

19. The method of claim 14, further comprising: providing a 2-input multiplexer to receive the first command signal and the second command signal; and, generating the selected command signal in response to a control signal generated by the control circuit.

20. The method of claim 19, further comprising: adjusting, by a phase interpolator, a phase of a receiving clock signal in response to the selected command signal to generate the first clock signal.

* * * * *